(12) United States Patent
Nilsson et al.

(10) Patent No.: US 7,088,041 B2
(45) Date of Patent: Aug. 8, 2006

(54) ENCAPSULATION OF POLYMER BASED SOLID STATE DEVICES WITH INORGANIC MATERIALS

(75) Inventors: Boo Nilsson, Santa Barbara, CA (US); Phillip Bailey, Goleta, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 369 days.

(21) Appl. No.: 10/752,902

(22) Filed: Jan. 6, 2004

(65) Prior Publication Data

US 2004/0140766 A1 Jul. 22, 2004

Related U.S. Application Data (60) Continuation of application No. 10/404,323, filed on Apr. 1, 2003, which is a division of application No. 09/368,324, filed on Aug. 3, 1999, now Pat. No. 6,635,989.

(60) Provisional application No. 60/095,155, filed on Aug. 3, 1998.

(51) Int. Cl.
*H05B 33/00* (2006.01)
(52) U.S. Cl. ........................ 313/512; 313/504
(58) Field of Classification Search ........... 313/504, 313/506, 512
See application file for complete search history.

(56) References Cited

U.S. PATENT DOCUMENTS

| | | | |
|---|---|---|---|
| 4,599,538 A * | 7/1986 | Hidler et al. ........... 313/512 |
| 4,767,679 A | 8/1988 | Kawachi |
| 4,839,557 A * | 6/1989 | Schrank ................. 313/509 |
| 4,963,788 A | 10/1990 | King et al. |
| 5,047,687 A | 9/1991 | Vanslyke |
| 5,059,862 A | 10/1991 | Vanslyke et al. |
| 5,151,629 A | 9/1992 | Vanslyke |
| 5,247,190 A | 9/1993 | Friend et al. |
| 5,317,169 A | 5/1994 | Nakano et al. |
| 5,408,109 A | 4/1995 | Heeger et al. |
| 5,512,654 A | 4/1996 | Holmes et al. |
| 5,652,067 A | 7/1997 | Ito et al. |
| 5,693,956 A | 12/1997 | Shi et al. |
| 5,723,873 A | 3/1998 | Yang |
| 5,757,126 A | 5/1998 | Harvey, III et al. |
| 5,804,917 A | 9/1998 | Takahashi et al. |
| 5,952,778 A | 9/1999 | Haskal et al. |
| 6,195,142 B1 | 2/2001 | Gyotoku et al. |

FOREIGN PATENT DOCUMENTS

WO    WO 98/57381    12/1998

OTHER PUBLICATIONS

Patent Abstracts of Japan, vol. 1998, No. 10, Aug. 31, 1998 & JP 10 125463 A (Matshushita Electric Ind. Co. Ltd.), May 15, 1998.

(Continued)

*Primary Examiner*—Joseph Williams (57) ABSTRACT

Methods for creating a protective seal suitable for protecting polymer-based electronic devices, including light emitting diodes and polymer emissive displays, are disclosed together with the protected devices. The protective seal includes one or more thin films of silicon nitride (SiN) or other inorganic dielectric applied at low temperature. One or more nonreactive metal layers may be present in the protective layer as well. Other embodiments are disclosed which include a protective cover over the protective layers. These protective layers provide encapsulation with sufficient protection from the atmosphere to enable shelf life and stress life for polymer electronic devices that are adequate for commercial applications.

22 Claims, 9 Drawing Sheets

OTHER PUBLICATIONS

Patent Abstracts of Japan, vol. 017, No. 424 (E-1410), Aug. 6, 1993 & JP 05 089959 A (Idemitsu Kosan Co. Ltd.), Apr. 9, 1993.
Patent Abstracts of Japan, vol. 1996, No. 08, Aug. 30, 1996 & JP 08 111286 A (TDK Corp.), Apr. 30, 1996.
Patent Abstracts of Japan, vol. 1995, No. 10, Nov. 30, 1995 & JP 07 169567 A (Idemitsu Kosan Co. Ltd.), Jul. 4, 1995 & JP 07 169567 T, Jul. 4, 1995.
J. H. Burroughs, et al., Nature, 347, 539, 1990.
D. Braun, et al., Appl. Phys. Lett., 58, 1982, 1991.
D. Braun, et al., J. Appl. Phys., 72, 564, 1992.
G. Grem, et al., Adv. Mater., 4, 36, 1992.
Z. Yang, et al., Macromolecules, 26, 1188, 1993.
I. D. Parker, et al., J. Appl. Phys., Appl. Phys. Lett., 65, 1272, 1994.
C. Zhang, et al., Synth. Met., 62, 35, 1994.
G. Gustafsson, et al., Nature, 357, 477, 1992.
H. Nishino, et al., Synth. Met., 48, 243, 1995.
I. D. Parker, J. Appl. Phys., 75, 1656, 1994.
Y. Yang, Appl. Phys. Lett., 64, 1245, 1994, no month.
Y. Yang, et al., J. Appl. Phys., 77, 694, 1995, no month.
J. Gao, et al., Synth. Met., 82, 221, 1996, no month.
M. A. Diaz-Garcia, et al., Appl. Phys. Lett., 70, 3191, 1997, no month.
J. Kido, et al., Appl. Phys. Lett., 67, 2281, 1995, no month.
J. C. Scott, et al., J. Appl. Phys., 79, 2745, 1996, no month.
I. D. Parker, et al., Appl. Phys. Lett., 64, 1774, 1994, no month.

* cited by examiner

FIG. 6(a)
FRESH DEVICE

FIG. 6(b)
24 HOURS OF STRESS

FIG. 6(c)
48 HOURS OF STRESS

FIG. 6
POLYMER LIGHT EMITTING DISPLAY WITHOUT PROTECTIVE LAYER AFTER EXPOSURE TO AMBIENT AIR

FIG. 7
POLYMER LIGHT EMITTING DISPLAY WITH PROTECTIVE LAYER
AFTER 288 HOURS OF EXPOSURE TO
50°C AND 95% RELATIVE HUMIDITY

FIG. 8
POLYMER LIGHT EMITTING DISPLAY
PACKAGED WITH CERAMIC FRAME SEAL

FIG. 9
POLYMER LIGHT EMITTING DISPLAY
PACKAGED WITH CERAMIC FRAME SEAL
AFTER 900 HOURS OF EXPOSURE TO
50°C AND 95% RELATIVE HUMIDITY

ENCAPSULATION OF POLYMER BASED SOLID STATE DEVICES WITH INORGANIC MATERIALS

FIELD OF THE INVENTION

This invention relates to methods of encapsulating solid state electronic devices and the encapsulated devices. More specifically, this invention relates to encapsulated organic polymeric light emitting devices. Principally this invention describes encapsulating such devices to prevent ambient moisture and oxygen from reacting with materials used in the fabrication of the devices.

BACKGROUND OF THE INVENTION

Diodes and particularly light emitting diodes (LED's) fabricated with conjugated organic polymer layers have attracted attention due to their potential for use in display technology [J. H. Burroughs, D. D. C. Bradley, A. R. Brown, R. N. Marks, K. Mackay, R. H. Friend, P. L. Burns, and A. B. Holmes, Nature 347, 539 (1990); D. Braun and A. J. Heeger, Appl. Phys. Lett. 58, 1982 (1991)]. These references as well as all additional articles, patents and patent applications referenced herein are incorporated by reference. Among the promising materials for use as active layers in polymer LED's are poly (phenylene vinylene), ("PPV"), and soluble derivatives of PPV such as, for example, poly(2-methyoxy-5-(2'-ethylhexyloxy)-1,4-phenylene vinylene), ("MEH-PPV"), a semiconducting polymer with an energy gap $E_g$ of =2.1 eV. This material is described in more detail in U.S. Pat. No. 5,189,136. Another material described as useful in this application is poly(2,5-bis(cholestanoxy)-1,4-phenylene vinylene), ("BCHA-PPV"), a semiconducting polymer with an energy gap $E_g$ of ~2.2 eV. This material is described in more detail in U.S. patent application Ser. No. 07/800,555. Other suitable polymers include, for example; OC1C10-PPV; the poly(3-alkylthiophenes) as described by D. Braun, G. Gustafsson, D. McBranch and A. J. Heeger, J. Appl. Phys. 72, 564 (1992) and related derivatives as described by M. Berggren, O. Inganas, G. Gustafsson, J. Rasmusson, M. R. Andersson, T. Hjertberg and O. Wennerstrom; poly(paraphenylene as described by G. Grem, G. Leditzky, B. Ullrich, and G. Leising, Adv. Mater. 4, 36 (1992), and its soluble derivatives as described by Z. Yang, I. Sokolik, F. E. Karasz in Macromolecules, 26, 1188 (1993), polyquinoline as described by I. D. Parker J. Appl. Phys, Appl. Phys. Lett. 65, 1272 (1994). Blends of conjugated semiconducting polymers in non-conjugated host polymers are also useful as the active layers in polymer LED's as described by C. Zhang, H. von Seggern, K. Pakbaz, B. Kraabel, H.-W. Schmidt and A. J. Heeger, Synth. Met., 62, 35 (1994). Also useful are blends comprising two or more conjugated polymers as described by H. Nishino, G. Yu, T-A Chen, R. D. Rieke and A. J. Heeger, Synth. Met., 48, 243 (1995) Generally, materials for use as active layers in polymer LED's include semiconducting conjugated polymers, more specifically semiconducting conjugated polymers which exhibit photoluminescence, and still more specifically semiconducting conjugated polymers which exhibit photoluminescence and which are soluble and processible from solution into uniform thin films.

In the field of organic polymer-based LED's it has been taught in the art to employ a relatively high work function metal as the anode; said high work function anode serving to inject holes into the otherwise filled π-band of the semiconducting, luminescent polymer. Relatively low work function metals are preferred as the cathode material; said low work function cathode serving to inject electrons into the otherwise empty π*-band of the semiconducting, luminescent polymer. The holes injected at the anode and the electrons injected at the cathode recombine radiatively within the active layer and light is emitted. The criteria for suitable electrodes are described in detail by I. D. Parker, J. Appl. Phys, 75, 1656 (1994).

Suitable relatively high work function metals for use as anode materials are transparent conducting thin films of indium/tin-oxide [H. Burroughs, D. D. C. Bradley, A. R. Brown, R. N. Marks, K. Mackay, R. H. Friend, P. L. Burns, and A. B. Holmes, Nature 347, 539 (1990); D. Braun and A. J. Heeger, Appl. Phys. Lett. 58, 1982 (1991)]. Alternatively, thin films of conducting polymers such as poly(aniline), ("PANI") can be used as demonstrated by G. Gustafsson, Y. Cao, G. M. Treacy, F. Klavetter, N. Colaneri, and A. J. Heeger, Nature, 357, 477 (1992), by Y. Yang and A. J. Heeger, Appl. Phys. Lett 64, 1245 (1994) and U.S. patent application Ser. No. 08/205,519, by Y. Yang, E. Westerweele, C. Zhang, P. Smith and A. J. Heeger, J. Appl. Phys. 77, 694 (1995), by J. Gao, A. J. Heeger, J. Y Lee and C. Y Kim, Synth. Met., 82,221 (1996) and by Y. Cao, G. Yu, C Zhang, R. Menon and A. J. Heeger, Appl. Phys. Lett. 70, 3191, (1997). Thin films of indium/tin-oxide and thin films of polyaniline in the conducting emeraldine salt form are preferred because, as transparent electrodes, both enable the emitted light from the LED to radiate from the device in useful levels.

Suitable relatively low work function metals for use as cathode materials are the alkaline earth metals such as calcium, barium, strontium and rare earth metals such as ytterbium. Alloys of low work function metals, such as for example alloys of magnesium in silver and alloys of lithium in aluminum, are also known in prior art (U.S. Pat. Nos. 5,047,687; 5,059,862 and 5,408,109). The thickness of the electron injection cathode layer has ranged from 200–5000 Å as demonstrated in the prior art (U.S. Pat. No. 5,151,629, U.S. Pat. No. 5,247,190, U.S. Pat. No. 5,317,169 and J. Kido, H. Shionoya, K. Nagai, Appl. Phys. Lett., 67(1995) 2281). A lower limit of 200–500 Ångstrom units (Å) is required in order to form a continuous film (full coverage) for cathode layer (U.S. Pat. No. 5,512,654; J. C. Scott, J. H. Kaufman, P. J. Brock, R. DiPietro, J. Salem and J. A. Goitia, J. Appl. Phys., 79(1996)2745; I. D. Parker, H. H. Kim, Appl. Phys. Lett., 64(1994)1774). In addition to good coverage, thicker cathode layers were believed to provide self-encapsulation to keep oxygen and water vapor away from the chemically active parts of the device.

Electron-injecting cathodes comprising ultra-thin layer alkaline earth metals, calcium, strontium and barium, have been described for polymer light emitting diodes with high brightness and high efficiency. Compared to conventional cathodes fabricated from the same metals (and other low work function metals) as films with thickness greater than 200 Å, cathodes comprising ultra-thin layer alkaline earth metals with thicknesses less than 100 Å (e.g., 15 Å to 100 Å) provide significant improvements in stability and operating life to polymer light emitting diodes [Y. Cao and G. Yu, U.S. patent application Ser. No. 08/872,657.

Unfortunately, although the use of low work function electrodes is required for efficient injection of electrons from the cathode and for satisfactory device performance, low work function metals such as calcium, barium and strontium are typically unstable and readily react with oxygen and/or water vapor at room temperature and even more vigorously at elevated temperatures.

Despite the improvements in the construction of polymer LED's, a persistent problem has been fast decay of the device efficiency (and light output) during storage and during stress, especially at elevated temperature. Thus, there is a need for methods of encapsulation of such devices, said encapsulation being sufficient to prevent water vapor and oxygen from diffusing into the device and thereby limiting the useful lifetime.

SUMMARY OF THE INVENTION

Light-emitting devices fabricated with organic polymeric materials as the active layers typically comprise reactive low work function metals such as, for example, calcium, barium, or strontium. During normal use of these devices, moisture and to a lesser extent oxygen can come in contact with these metals and react to form hydroxides and/or oxides. Exposure to oxygen, particularly in the presence of light, can lead to photo-oxidative degradation of the luminescent semiconducting polymer as well. Such reactions will significantly reduce the performance of the light emitting properties of the devices. Prolonged exposure to ambient air leads to significant reduction in light output from devices. Often these reactions will lead to a complete elimination of the light emitting properties of these devices, rendering them useless as light sources. Many of the known processes for achieving a hermetic encapsulation of electronic devices require that the devices be heated to temperatures in excess of 300° C. during the encapsulation process. Most polymer based light-emitting devices are not compatible with such high temperatures.

We have now found a technique for encapsulating polymeric light-emitting devices at the low method temperatures. The method of encapsulation provides a hermetic seal between the device and the ambient air with its harmful moisture and oxygen.

The method for encapsulation of this invention is one in which the overall thickness of the device is not significantly increased by the encapsulation of the device.

The method can, if desired, be carried out with fewer individual process steps than methods known to the art.

In accord with this invention the entire device is protected by depositing at low temperatures a thin film comprising an inorganic refractory material, such as a ceramic, for example silicon-nitride or silicon-oxide over the reactive cathodes present in the device structure. In a preferred embodiment, the deposit of the inorganic refractory material layer is preceded by depositing at low temperatures a thin film of a non-reactive metal, such as aluminum, over the reactive cathode metal. Following this layer, the thin film comprising an inorganic refractory material, such as a ceramic for example silicon-nitride or silicon-oxide is laid down, again at low temperatures. The two layer structure is preferred. When depositing these layers at low temperatures, such as below about 300° C., they typically contain microscopic pinholes. If the single layer of metal were used alone as encapsulation, moisture and oxygen would be able to penetrate these pinholes and harm the performance of the device. However, because the probability of a pinhole occurring at exactly the same location in both layers is insignificant, the use of two layers, the non-reactive metal layer and then the refractory thin film, prevent moisture and oxygen from reaching the reactive materials in the device. This occurs even though the layers are deposited at temperatures below 100° C.

In a preferred embodiment of the invention, the non-reactive metal layer is patterned in such a way as to form rows across the device. This geometry is often used to fabricate matrix displays by forming pixels at the intersections of rows and columns. In this embodiment the harmful moisture and oxygen can reach the reactive components of the device at the edge of the non-reactive metal rows. The subsequently-deposited ceramic film prevents moisture and oxygen from reaching the reactive metal in this embodiment of the invention.

In another preferred embodiment the non-reactive metal layer and ceramic thin film layer is followed by a thin lid secured by a frame of epoxy around the perimeter of the device. This lid offers additional protection from ambient moisture and oxygen. The lid can be fabricated from any material, which offers a sufficient barrier against moisture and oxygen. Some examples of lids are, plastics, glass, ceramics and other non-reactive metals.

In yet another preferred embodiment of the invention the lid is secured by dispersing epoxy over a substantial region such as the entire light-active area of the device.

In yet another preferred embodiment of the invention the ceramic thin film is patterned into a frame shape. A thin film metal is deposited on top of this ceramic frame and patterned into the same frame shape. An identically shaped metal thin film is deposited and patterned on the cover plate. The cover plate is attached to the ceramic thin film frame using metal solder. In this structure the solder and the ceramic thin film frame provide the sealing of the device.

In yet another preferred embodiment of the invention a ceramic thin film is deposited over the entire active area of the device. A thin film metal is deposited and patterned into a frame shape. A similar metal frame is formed on the cover lid. The cover plate is attached to the ceramic thin film frame using metal solder.

BRIEF DESCRIPTION OF THE DRAWINGS

The present invention will be further described with referecne being made to the accompanyiong drawings in which:

FIG. 7 shows in schematic view a device that has been protected using the method of the invention in the configuration of the embodiment shown in FIG. 2. The display shown in FIG. 2 has been exposed for 288 hours to a 50° C. temperature and a 95% relative humidity. Notice how no significant size reduction of the light emitting areas of the pixels can be observed in this display even though it has been exposed to much harsher conditions than the device shown in FIG. 6. It should also be noted that the display in this figure does show a few imperfections appearing as incursions into light emitting areas. These "black-spots" do develop over time when the display is exposed to high relative humidity. These "black-spots are due to imperfections in the this ceramic layer. These imperfections do allow moisture and to a lesser extent oxygen to slowly diffuse trough the layer and react with the reactive metals contained in the cathode metal.

FIG. 9 shows in schematic view the active area of the device shown in FIG. 8. This particular embodiment is also shown in FIG. 4 above and described in example 4 below. In this case the device has been exposed for 900 hours to a 50° C. temperature and a 95% relative humidity. Notice how a device packaged with this method shows no reduction in the light emitting area of the pixels even after prolonged exposure to high relative humidity. Additionally, it should be noted that no other imperfections or incursions into the light-emitting areas to such as "black-spots" could be seen on devices packaged with this method.

DESCRIPTION OF PREFERRED EMBODIMENTS

Figure 1:
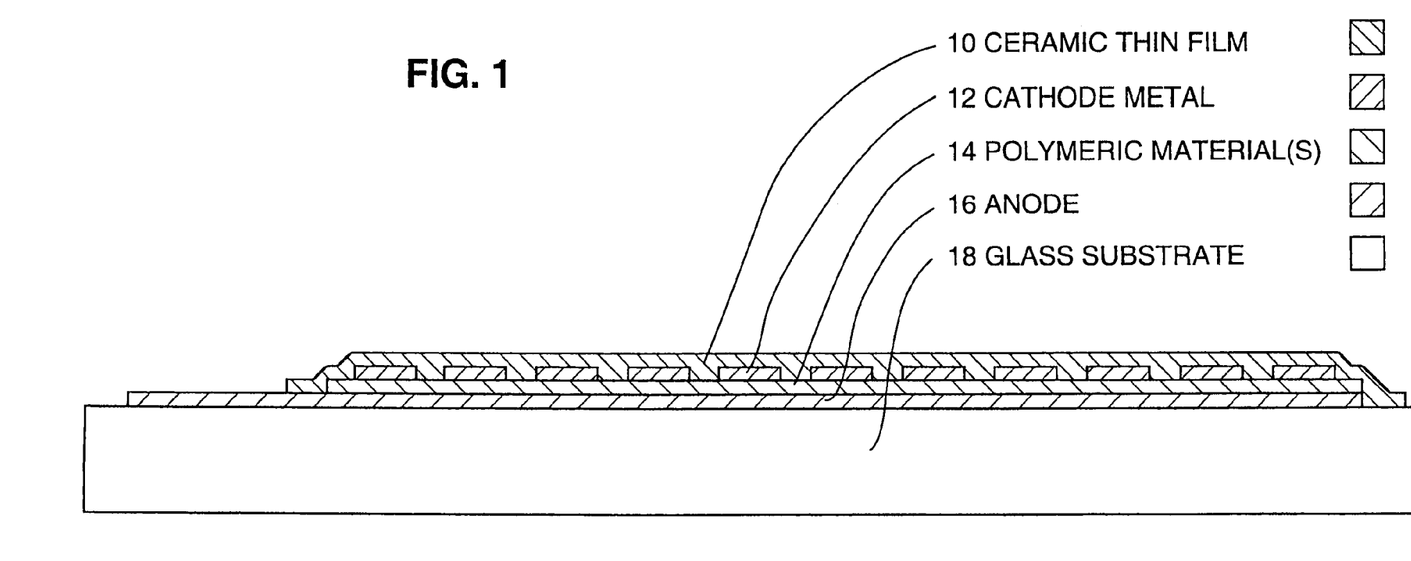
FIG. 1 shows a schematic cross-sectional view of one embodiment of a polymer-bassed electronic device protected in accord with the present invention.

FIG. 1 shows one embodiment of the invention. FIG. 1 shows a cross-section of the light-emitting device, which consists of the substrate 18 on which a transparent anode layer 16 has been deposited. The anode 16 is followed by one or more polymeric layer(s) 14 and a cathode metal layer 12. In the embodiment shown in FIG. 1, the device is covered with a ceramic thin film protective layer 10 protecting the sensitive cathode metal layer as well as the polymeric layer(s).

Figure 2:
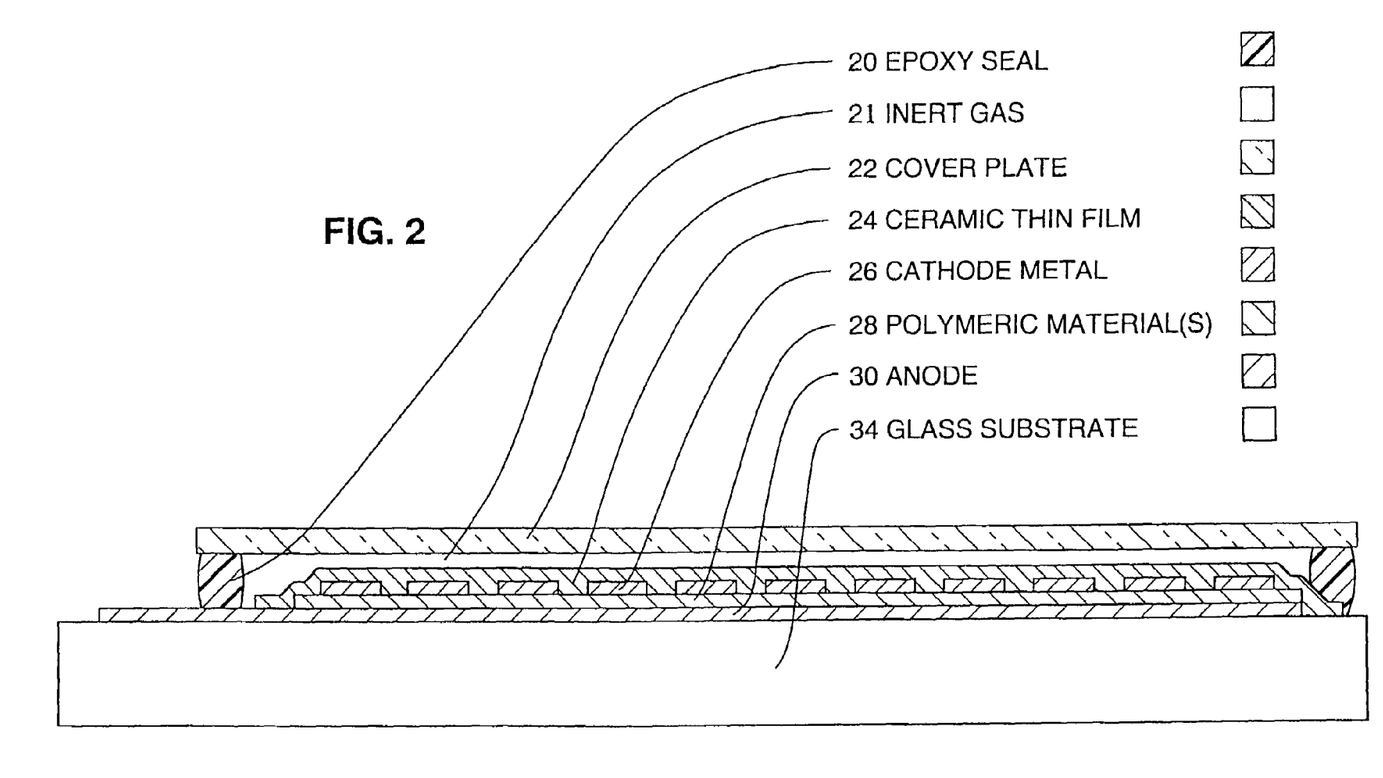
FIG. 2 shows a schematic cross-sectional view of another embodiment of an electronic device in accord with the invention.

FIG. 2 shows another embodiment of the invention. FIG. 2 shows a cross-section of the device consisting of the substrate 34 followed by the anode 30, the polymeric layer(s) 28 and the cathode 26. The ceramic thin film protective layer 24 protects the device. The protective layer 24 is enclosed in a cavity, which is filled with an inert gas 21, such as nitrogen or argon. A cover plate 22 and a perimeter seal of epoxy 20 form the cavity.

Figure 3:
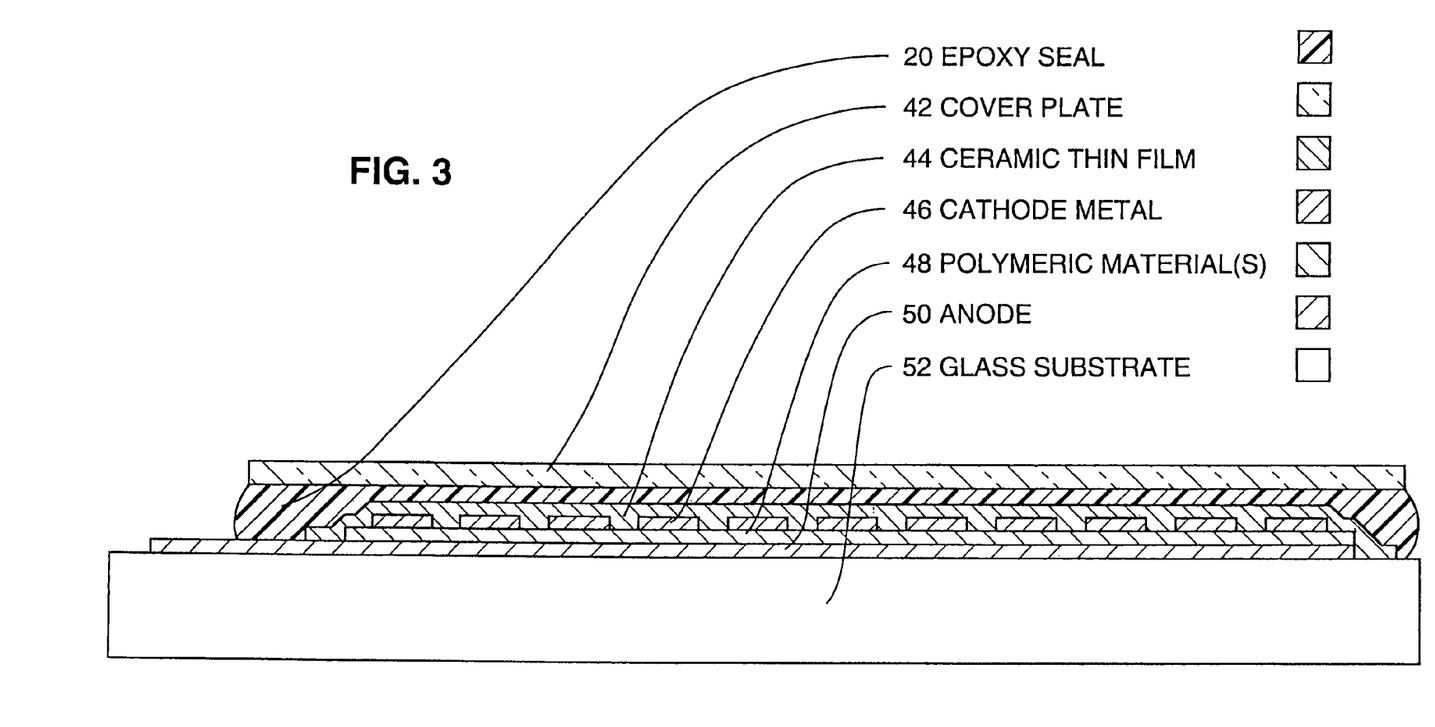
FIG. 3 shows a schematic cross-sectional view of yet another embodiment of the invention.

FIG. 3 shows yet another embodiment of the invention. FIG. 3 shows a cross-section of the device consisting of the substrate 52 followed by the anode 50, the light-active polymeric layer(s) 48 and the cathode 46. The device is protected by the ceramic thin film protective layer 44. The protective layer 44 is covered by a layer of epoxy 20 followed by a cover plate 42.

Figure 4:
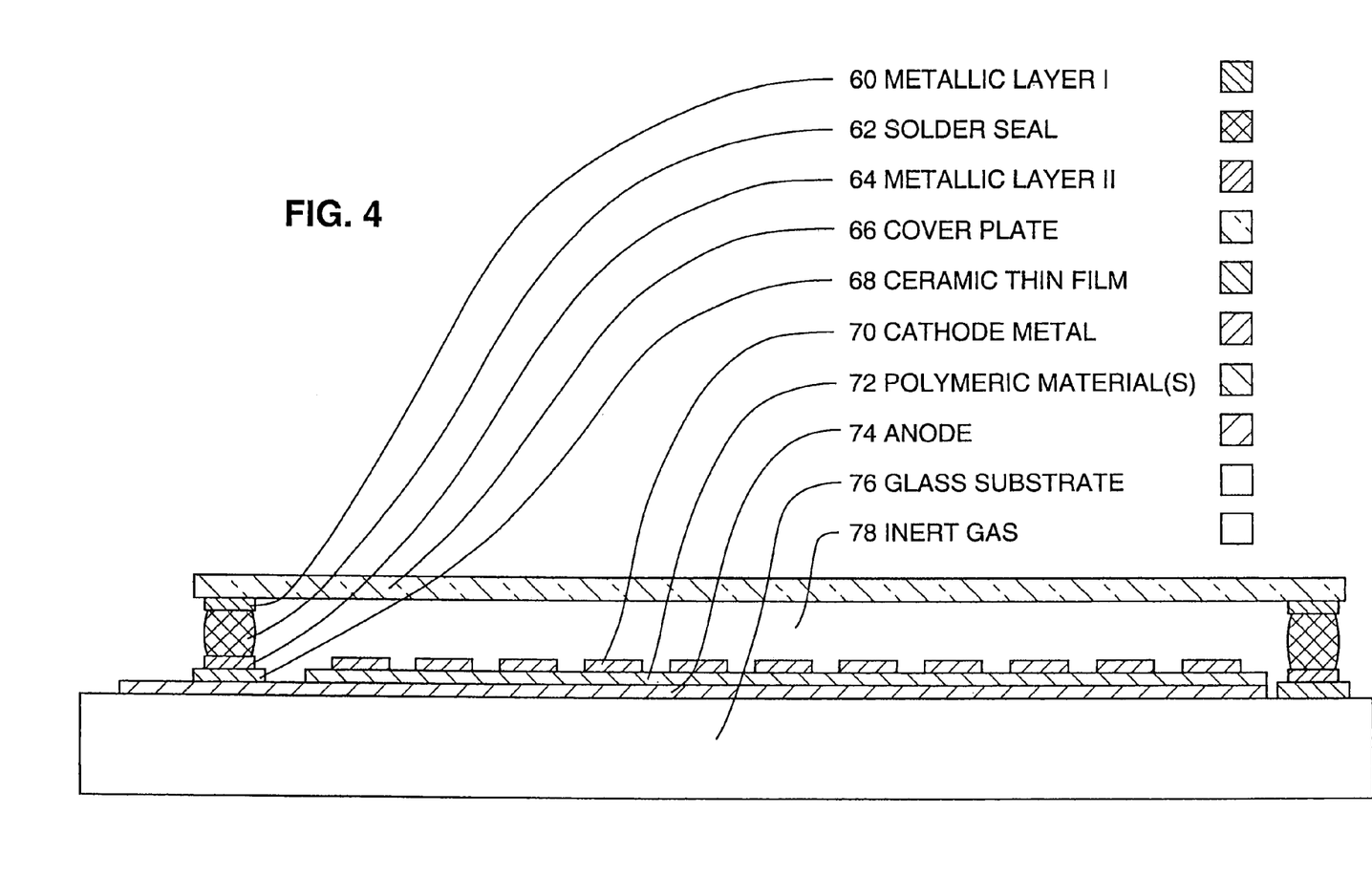
FIG. 4 shows a schematic cross-sectional view of yet another embodiment of the invention.

FIG. 4 shows yet another embodiment of the invention. FIG. 4 shows a cross-section of the device consisting of the substrate 76 followed by the anode 74, the active polymeric layer(s) 72 and the cathode 70. In this embodiment of the invention a ceramic thin film 68 is used to form a frame around the air-sensitive components of the device. On top of this frame 68 a thin film metal layer 64 is formed in same frame shape as the ceramic thin film 68. On the cover plate 66 another metallic layer 60 is formed also in the same shape as the ceramic thin film 68. The cover plate 66 is attached to device using a metallic solder 62 around the entire perimeter of the device. To facilitate the soldering process a metallic layer 60 is formed on the cover plate. The shape of this metallic layer 60 matches the shape of the metallic layer on the device 64 and the ceramic thin film frame 68. The soldering is performed in an inert atmosphere so that the cavity formed is filled with an inert gas 78 such as nitrogen or argon.

Figure 5:
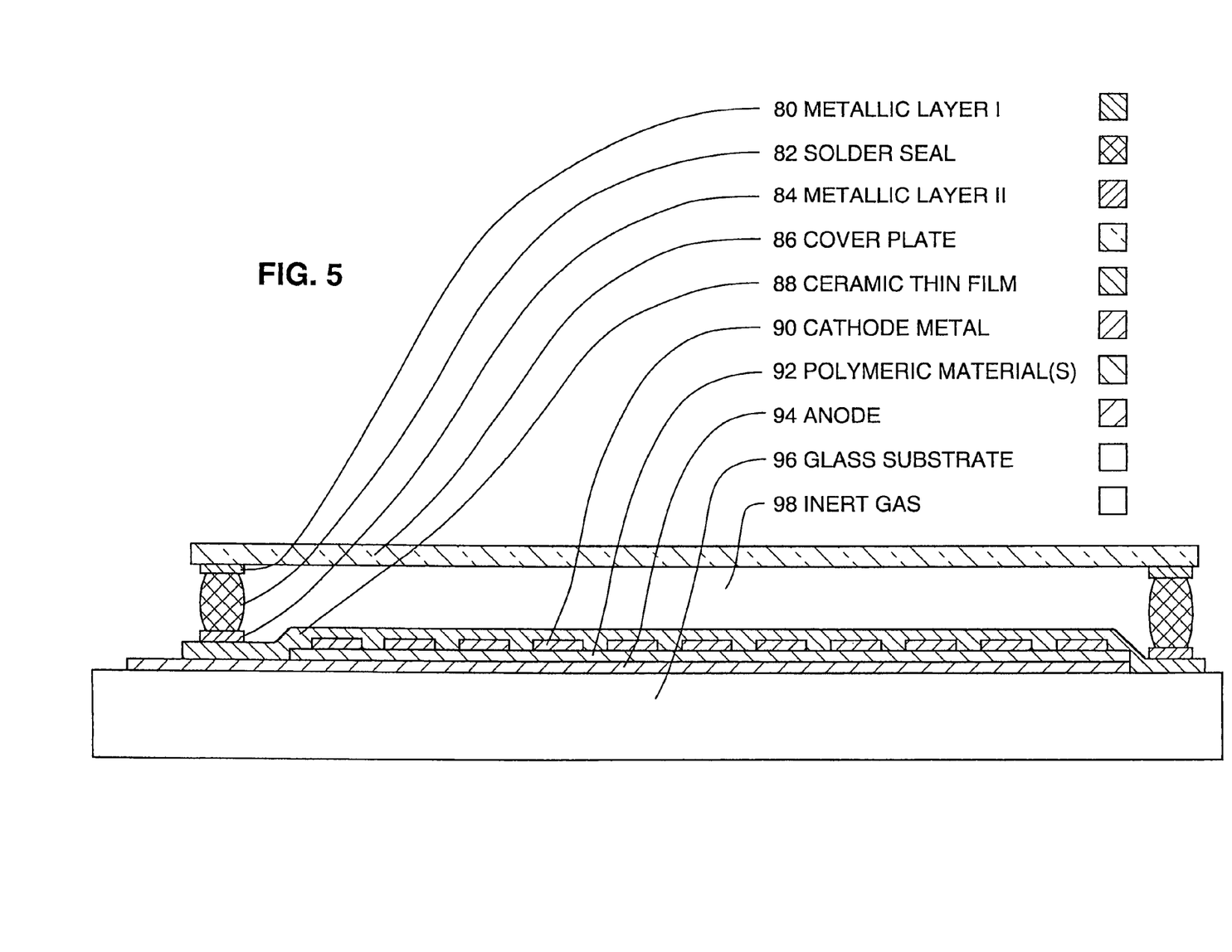
FIG. 5 shows a schematic cross-sectional view of yet another embodiment of the invention.

FIG. 5 shows yet another embodiment of the invention. FIG. 5 shows a cross-section of the device consisting of the substrate 96 followed by the anode 94, the polymeric layer(s) 92 and the cathode 90. In this embodiment of the invention a ceramic thin film 88 is used to as a first barrier to protect the device. On top of this ceramic layer 88 a thin film metal layer 84 is formed in same frame shape. On the cover plate 86 another metallic layer 80 is formed in the same shape as the first metallic frame 84. The cover plate 86 is attached to device using a metallic solder 82 around the entire perimeter of the device. To facilitate the soldering process a metallic layer 80 is formed on the cover plate. The shape of this metallic layer 80 matches the shape of the metallic layer on the device 84. The soldering is performed in an inert atmosphere so that the cavity formed is filled with an inert gas 98 such as nitrogen or argon.

Figures 6, 6A, 6B, 6C:
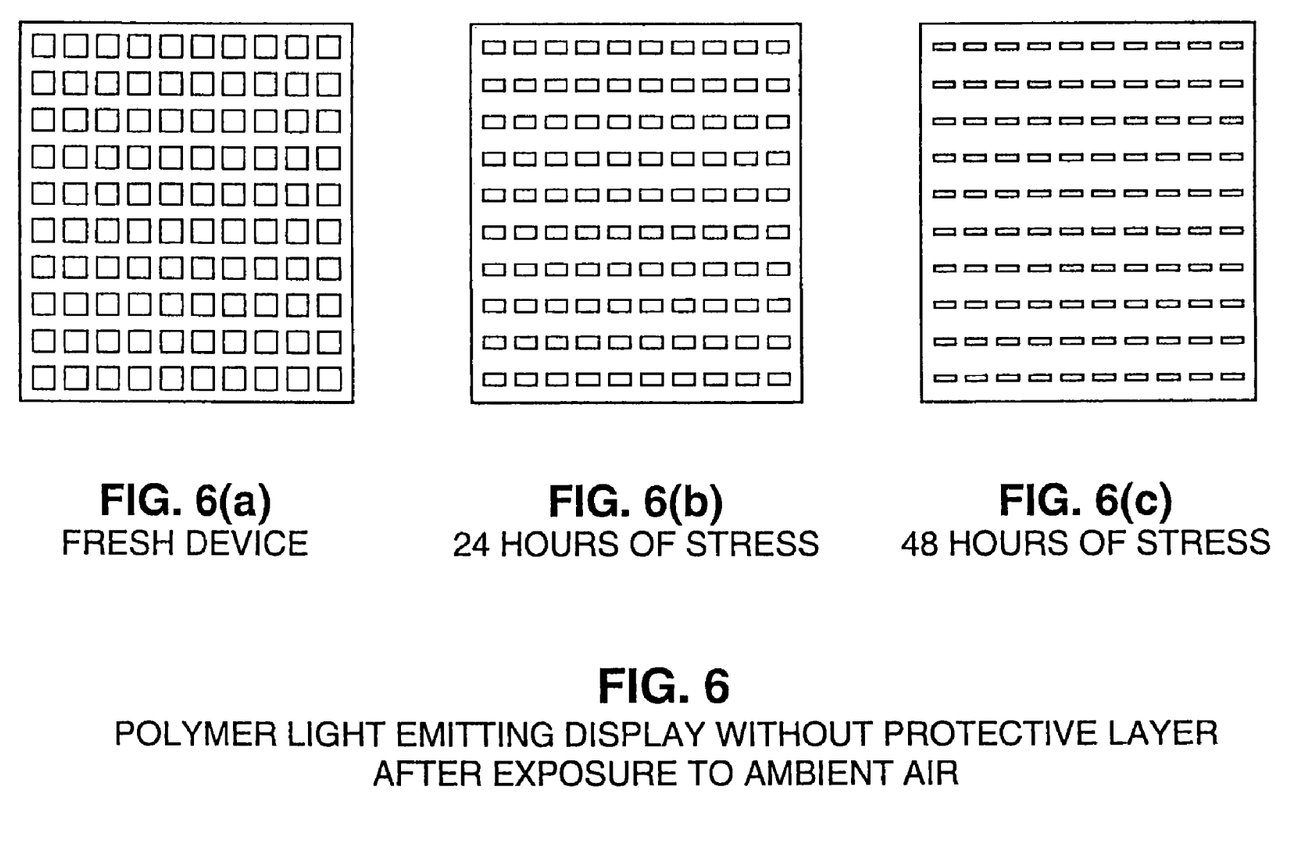
FIG. 6 shows in plain view, three schematic views of a polymer light emitting display, freshly made and after two periods of use to illustrate the dregradation in device performance with environmental exposure in terms of the amount of area of the device actively emitting light.

FIG. 6 shows a polymer light emitting display. The same display is shown in three stages; FIG. 6a shows a freshly made device. The light-emitting areas are the square areas. FIG. 6b shows an identical device that has been exposed to ambient air, approximately 25° C. and 30–40% relative humidity for a period of 24 hours. FIG. 6c shows the same device after 48 hours of exposure to ambient air at the same condition. Notice how the light emitting areas of the pixels have been significantly reduced after 24 hours. Further notice how the light emitting areas have almost completely vanished after only 48 hours of exposure to ambient air. FIG. 6 clearly highlights the importance of a proper packaging technique for polymer light emitting displays.

Figure 7:
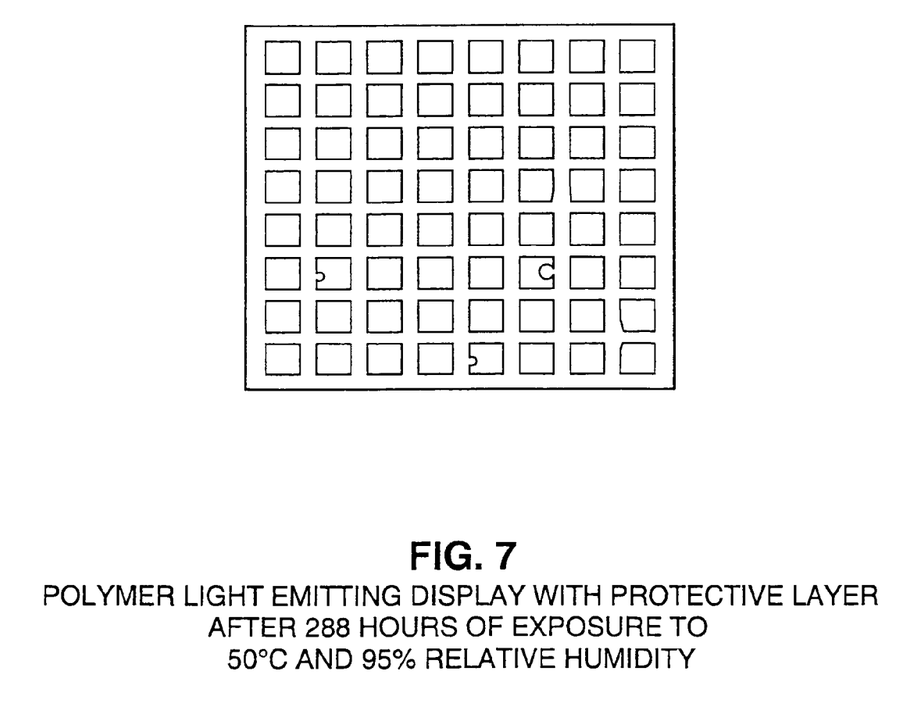

FIG. 7 shows a device that has been packaged in the configuration shown in FIG. 2. The display shown in FIG. 2 has been exposed for 288 hours to a 50° C. temperature and a 95% relative humidity. Notice how no significant size reduction of the light emitting areas of the pixels can be observed in this display even though it has been exposed to much harsher conditions than the device shown in FIG. 6. It should also be noted that the display in this figure does show a few imperfections appearing as non-light emitting incursions into the light emitting areas. These "black-spots" do develop over time when the display is exposed to high relative humidity. These "black-spots are due to imperfections in the this ceramic layer. These imperfections do allow moisture and to a lesser extent oxygen to slowly diffuse trough the layer and react with the reactive metals contained in the cathode metal.

Figure 8:
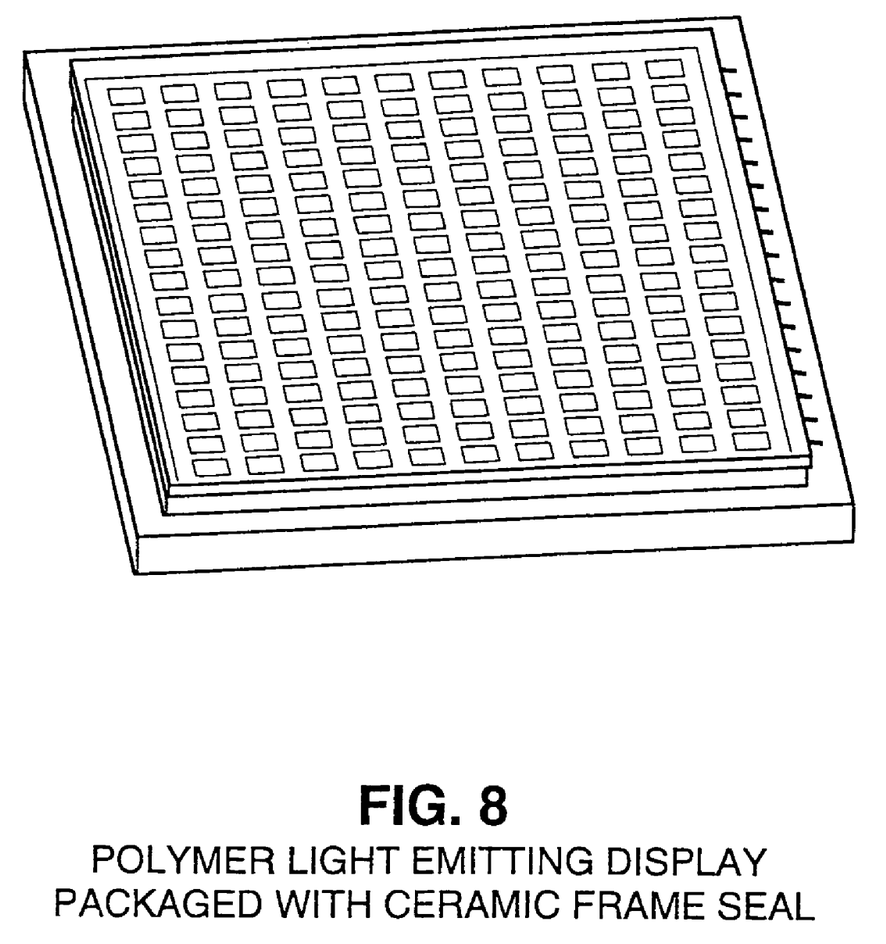
FIG. 8 shows a perspective view of a display as shown in FIG. 4 and as described in example 4 below.

FIG. 8 shows a perspective view of a display as shown in FIG. 4 and as described in example 4 below.

Figure 9:
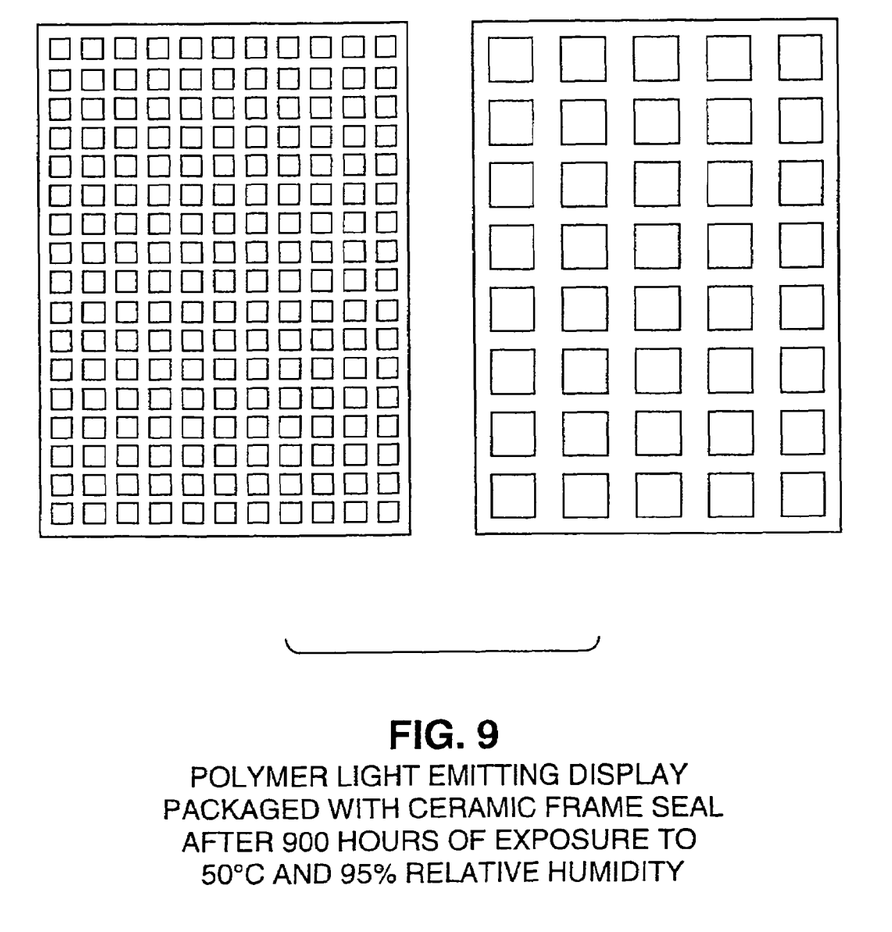

FIG. 9 shows two magnifications of the active area of the device shown in FIG. 8. This particular embodiment is also shown in FIG. 4 above and described in example 4 below. In this case the device has been exposed for 900 hours to a 50° C. temperature and a 95% relative humidity. The light-emitting areas are the squares with the surrounding areas being non light-emitting. Notice how a device packaged with this method shows no reduction in the light emitting area of the pixels as evidenced by their square shape and absence of incursions even after prolonged exposure to high relative humidity. Additionally it should be noted that no other imperfections such as "black-spots" could be seen on devices packaged with this method.

In accord with this invention a ceramic thin film is used to prevent ambient moisture and oxygen from coming into contact with the electrodes and the polymeric layer(s) of the device which components are electrically and chemically active. The inorganic refractory material is made up of one or more oxides and/or nitrides. These materials can be typically selected from full and partial oxides and nitrides of the group IIIb and IVb elements. These include the oxides and nitrides of boron, aluminum, silicon, gallium, germanium, indium, tin, tantalum and lead. Silicon, aluminum, indium and tin are the preferred metals for forming refractory oxides and nitrides, with silicon and aluminum and especially silicon being most preferred.

The inorganic refractory layer(s) should be from about 0.025 μm to several (10) microns in thickness with a thicknesses of from 0.05 to 5 microns being preferred.

A cross-section of one embodiment of this structure is shown in FIG. 1. The ceramic layer must be of sufficient integrity to establish a hermetic barrier to moisture and oxygen. Inorganic refractory materials such as ceramic materials, for example as silicon-nitride ($Si_xN_y$), silicon-monoxide (SiO) or silicon dioxide ($SiO_2$), can exhibit the necessary barrier properties if thin films can be formed with sufficient density. However, in order to achieve dense films of these types of materials in the past, films must be deposited at elevated temperatures, typically in excess of 400° C. Recently high-density films have been demonstrated at temperatures below 150° C. using a high-density plasma during the film deposition. These lower deposition temperatures have enabled us to consider the use of ceramic thin films as protective barriers in polymer light emitting devices. At these low deposition temperatures, it is usually not possible to achieve thin films that are completely free of microscopic pinholes. However, it is possible to produce ceramic films with pinhole densities of less than ~10 pinholes per $cm^2$. Since such a pinhole density cannot provide a hermetic seal for the polymer light emitting devices, it is surprising and unexpected that by combining these thin ceramic films with a cathode metal structure consisting of a very thin layer (~1–100 nm) of a low work function metal, such as calcium, barium or strontium, followed by a thicker layer (>100 nm) e.g., 100 to 10,000 nm and especially 100 to 1,000 nm of non reactive metal, such as aluminum, copper or silver, it is possible to achieve extremely low pin-hole densities (<<0.1 pin-holes/$cm^2$). Although both the ceramic layer and the cathode metal film have pin-hole densities in the range of 1–10 pin-holes/$cm^2$, these pin-holes are extremely small typically <<10 μm in diameter. Therefore, the probability of these pinholes occurring directly on top of each other is extremely low resulting in pinhole density for the entire stack of much less than 0.1 pin-holes/$cm^2$.

The protective layers are formed using a low temperature deposition method. By low temperature is meant a method which deposits the layers at a substrate temperature of below about 400° C., such as below 350° C. Sputtering, including reactive sputtering, may achieve this if the substrate is adequately cooled. Plasma-enhanced chemical vapor deposition is a preferred method since it achieves a high density film at temperatures of from just above ambient (40° C.) to below 300° C. These methods are known in the art.

FIG. 6 shows an example of a matrix array of polymer light emitting pixels before and after exposure to a high temperature high humidity test. Notice how the pixels without the ceramic thin film are being gradually attacked by the moisture eventually completely eliminating the light output from this device. A similar sample with the ceramic thin film barrier is also shown for comparison in FIG. 7. With the ceramic thin film barrier, this sample is completely unaffected under the same test conditions.

FIG. 2 shows another embodiment of the invention consisting of the same structure as described above with an added barrier consisting of a cover plate 22 made from ceramic, glass or metallic materials. This lid is attached to device via a perimeter seal of epoxy 20. The purpose of the cover plate and epoxy seal is to reduce the requirements on the ceramic thin film protective layer by providing an additional barrier against moisture and oxygen.

FIG. 3 shows yet another embodiment of the invention where the lid is attached by completely filling the area between the device and the device with epoxy.

FIG. 4 shows yet another embodiment of the invention. In this embodiment the lid is attached to device using a metallic solder. The lid and the solder provide the hermetic seal in this embodiment. The ceramic thin film provides electrical insulation as to prevent short circuits between the anode and cathode leads and the solder-seal. In this embodiment the ceramic was structured to the shape of the frame as shown in FIG. 4 and FIG. 8. In this embodiment the ceramic layer can be deposited prior to application of the temperature sensitive polymeric materials, thus allowing for a wider range of process temperatures.

FIG. 5 shows yet another embodiment of the invention. In this embodiment the lid is attached to the device using a metallic solder. The ceramic thin film provides electrical insulation as to prevent short circuits between the anode and cathode leads and the solder-seal. In this embodiment that solder seal and cover plate provide the primary protection and the thin ceramic film provides a secondary barrier protecting the device.

The remarkable improvement in stability and lifetime of the polymer LED's when encapsulated with the methods described in this invention is documented in the Examples.

EXAMPLES

Example 1

In this example, a polymer light emitting display consisting of an array of pixels (30×60) was fabricated. The fabrication of the Display required several steps. First, the anode layer, consisting of Indium Tin Oxide (ITO), was patterned on the glass substrate into columns; in this Example 60 columns were formed. The entire device was then coated with a light emitting polymer material. Examples included OC1C10-PPV and MEH-PPV and related soluble PPV derivatives. Next the cathode metal, consisting of a thin layer of a low work-function metal was deposited, followed by deposition of a layer of Aluminum (the Aluminum layer was added simply to protect the more reactive Ca layer). The cathode layer was patterned in such a way as to form rows; said rows were oriented perpendicular to the underlying anode columns. In this example 30 rows were formed. Light emitting pixels were formed, thereby, at each column-row intersection. Hence the display in this example consisted of 1800 pixels. In order to prevent oxygen and moisture from the ambient air from reacting with the low work-function metal in the cathode, the entire device was coated with a thin layer (~1 micron) of silicon-nitride. The coating was performed using Plasma Enhanced Chemical Vapor Deposition (PECVD). By utilizing a high-density plasma, this deposition was accomplished with the display at a temperature of only 85° C. Exposure of the display to this relatively low temperature caused no significant damage, yet a thin film of silicon-nitride with a low pinhole density was formed. This thin film of silicon-nitride together with the protective layer of Aluminum forms a near hermetic seal preventing oxygen and moisture from the ambient air from reaching the reactive metal underneath the Aluminum layer. A cross section of a device as described in this Example is shown in FIG. 1. FIG. 6 shows the degradation of pixels in an unprotected device when exposed to high humidity. FIG. 7 shows a device sealed as described in this Example. Note how no significant degradation can be seen at the horizontal edges of the light emitting pixels in the silicon-nitride coated device.

Example 2

In this Example, a polymer emissive display was fabricated as described in Example 1. Following the deposition of silicon-nitride layer a secondary lid was applied. This lid consisted of a thin (0.7 mm) glass plate. The lid was attached to the device using a perimeter seal of epoxy. The epoxy seal was located outside the perimeter of the silicon-nitride layer. The sealing was performed in an inert gas environment, a controlled atmosphere dry box containing, argon gas (alternatively, nitrogen gas was also be used). The purpose of this secondary seal is to further increase the lifetime of the device by increasing the time it takes for any moisture in the ambient air to reach the reactive low work-function metal in the cathode of the display. Any moisture from the ambient air must first penetrate the epoxy seal and then diffuse through any pinhole or imperfection in the silicon-nitride layer. A cross-section of this type of device is shown in FIG. 2.

Example 3

In this Example, a polymer emissive display was fabricated as described in Example 1. Following the deposition of silicon-nitride layer a secondary lid was applied. This lid consisted of a thin (0.7 mm) glass plate. The lid was attached to the device using an evenly distributed layer of epoxy. The epoxy seal was located outside the perimeter of the silicon-nitride layer. The sealing was performed in an inert gas environment, a controlled atmosphere dry box containing, argon gas (alternatively, nitrogen gas was also be used). The purpose of this secondary seal is to further increase the lifetime of the device by increasing the time it takes for any moisture in the ambient air to reach the reactive low work-function metal in the cathode of the display. Any moisture from the ambient air must first diffuse through the epoxy seal and then diffuse through any pinhole or imperfection in the silicon-nitride layer. A cross-section of this type of device is shown in FIG. 3.

Example 4

This Example involves a polymer emissive display, which was similar to the device described in Example 1–3. However, the process sequence was changed to allow for a wider process window during the silicon-nitride deposition. In this Example, the anode columns were formed as in Example 1. Following the patterning of the anode, a thin layer of silicon-nitride was deposited. The silicon-nitride layer was structured as to form a frame surrounding the active area of the display. A thin layer of metal was then deposited on top of the silicon-nitride frame. Next the light emitting polymer layer was deposited followed by the cathode which was patterned into rows, as described in Example 1 above. A separate glass lid with a matching metal frame was fabricated and attached to the display using a low melting point solder. In this Example, the glass-lid and the metal-solder frame produced the seal. The silicon-nitride layer provided electrical insulation, which prevented the solder from shorting the anode and cathode lines. A cross-section of this device is shown in FIG. 4. A photo of this device is shown in FIG. 8. A photo of a device after extensive exposure to high humidity conditions is shown in FIG. 9. Note the complete absence of black spots as well as no observable reduction in emitted light at the edges of the pixels.

Example 5

In this example, a polymer emissive display was constructed as described in Example 1 above. Following the silicon-nitride deposition, a metal frame was deposited around the perimeter of the silicon-nitride layer. A separate glass lid was fabricated also with a metal frame the dimensions of which matched the frame on the silicon-nitride layer in size and shape. The glass lid was subsequently attached to the display using a low melting point solder (135° C., in this Example). In this case the primary protection of the display came from the glass lid and its associated metal solder seal. The purpose of the silicon-nitride in this Example was to prevent the metal frame seal from creating electrical shorts between the columns forming the anode and the rows forming the cathode. A cross-section of this device is shown in FIG. 5.

We claim:

1. In a light-emitting device comprising a layer of an active light-emitting polymer sandwiched between a cathode and an anode and a protective layer, the improvement of the protective layer consisting essentially of:
    an encapsulating layer of low-temperature-applied inorganic material protecting the device against environmental attack, wherein the low-temperature-applied inorganic material comprises an oxide of boron (B), aluminum (Al), gallium (Ga), indium (In), thallium (Tl), carbon (C), silicon (Si), germanium (Ge), tin (Sn) or lead (Pb);
    a low-temperature-applied coating comprising a non-reactive metal, wherein the low-temperature-applied coating is located between the device and the layer of inorganic material such that the low-temperature applied coating is next to the layer of inorganic material; and
    a protective cover plate attached to the layer of inorganic material such that the layer of inorganic material is located between the low-temperature-applied coating and the protective cover plate.

2. The device of claim 1 wherein the inorganic material is a silicon-based material.

3. The device of claim 2 wherein the silicon-based material is silicon-oxide.

4. The device of claim 1 wherein the protective cover plate is attached with epoxy.

5. The device of claim 4 wherein the epoxy is around the perimeter of the cover plate.

6. The device of claim 5 additionally comprising an inert gas between the cover plate and the layer of inorganic material.

7. The device of claim 1 wherein the protective cover plate is attached with solder.

8. The device of claim 1 wherein the coating of inorganic material is in the form of a frame plate.

9. The device of claim 1 wherein the layer of inorganic material is applied at a temperature below 400° C.

10. The device of claim 1 wherein the non-reactive metal is applied at a temperature below 400° C.

11. The device of claim 2 wherein both the non-reactive metal and the inorganic material are applied at a temperature below 400° C.

12. A method for protecting a light-emitting device against water vapor and oxygen diffusion comprising an active light-emitting polymer sandwiched between a cathode and an anode consisting essentially of the steps of:

encapsulating said device with an encapsulating layer of low-temperature-applied inorganic material, wherein the low-temperature-applied inorganic material comprises an oxide of boron (B), aluminum (Al), gallium (Ga), indium (In), thallium (Tl), carbon (C), silicon (Si), germanium (Ge), tin (Sn) or lead (Pb);

depositing a layer of a low-temperature applied coating comprising a non-reactive metal onto the device, wherein the low-temperature-applied coating is located between the device and the layer of inorganic material such that the low-temperature applied coating is next to the layer of inorganic material; and attaching a protective plate to the layer of inorganic material such the layer of inorganic material is located between the low-temperature-applied coating and the protective plate.

13. The method of claim 12 wherein the inorganic material is a silicon-based material.

14. The method of claim 13 wherein the silicon-based material is silicon-oxide.

15. The method of claim 12 wherein the protective cover plate is attached with epoxy.

16. The method of claim 15 wherein the epoxy is around the perimeter of the cover plate.

17. The method of claim 16 additionally comprising an inert gas between the cover plate and the layer of inorganic material.

18. The method of claim 12 wherein the protective cover plate is attached with solder.

19. The method of claim 12 wherein the coating of inorganic material is in the form of a frame plate.

20. The method of claim 12 wherein the layer of inorganic material is applied at a temperature below 400° C.

21. The method of claim 12 wherein the non-reactive metal is applied at a temperature below 400° C.

22. The method of claim 12 wherein both the non-reactive metal and the inorganic material are applied at a temperature below 400° C.

\* \* \* \* \*